United States Patent
Kim et al.

(10) Patent No.: US 11,626,572 B2
(45) Date of Patent: Apr. 11, 2023

(54) METHOD OF FABRICATING COVER WINDOW, COVER WINDOW AND DISPLAY DEVICE INCLUDING THE SAME

(71) Applicant: Samsung Display Co., Ltd., Yongin-si (KR)

(72) Inventors: Byeong Beom Kim, Asan-si (KR); Min Ki Kim, Hwaseong-si (KR); Yu Ri Kim, Guri-si (KR); Hoi Kwan Lee, Suwon-si (KR)

(73) Assignee: Samsung Display Co., Ltd., Yongin-si (KR)

(*) Notice: Subject to any disclaimer, the term of this patent is extended or adjusted under 35 U.S.C. 154(b) by 114 days.

(21) Appl. No.: 17/198,552

(22) Filed: Mar. 11, 2021

(65) Prior Publication Data
US 2021/0384456 A1    Dec. 9, 2021

(30) Foreign Application Priority Data

Jun. 3, 2020  (KR) .......................... 10-2020-0067162

(51) Int. Cl.
*H01L 51/52* (2006.01)
*H01L 51/00* (2006.01)
*H01L 51/56* (2006.01)

(52) U.S. Cl.
CPC ........ *H01L 51/524* (2013.01); *H01L 51/0097* (2013.01); *H01L 51/56* (2013.01); *H01L 2251/5338* (2013.01)

(58) Field of Classification Search
None
See application file for complete search history.

(56) References Cited

U.S. PATENT DOCUMENTS

| 10,375,839 | B2* | 8/2019 | Jung | H05K 1/189 |
| 11,322,054 | B2* | 5/2022 | Park | G09F 9/301 |
| 2020/0064886 | A1* | 2/2020 | Cho | G09F 9/301 |
| 2020/0292731 | A1 | 9/2020 | Park et al. | |
| 2020/0324521 | A1 | 10/2020 | Park et al. | |
| 2020/0329575 | A1* | 10/2020 | Park | H05K 5/03 |
| 2021/0107826 | A1 | 4/2021 | Hwang et al. | |
| 2021/0282285 | A1* | 9/2021 | Sunwoo | B32B 17/06 |

FOREIGN PATENT DOCUMENTS

| JP | 2019-194142 A | 11/2019 |
| KR | 10-2017-0009833 A | 1/2017 |
| KR | 10-2017-0122554 A | 11/2017 |
| KR | 10-2068685 B1 | 1/2020 |
| KR | 10-2069040 B1 | 1/2020 |
| KR | 10-2111138 B1 | 5/2020 |
| WO | WO 2017/186857 A1 | 11/2017 |

OTHER PUBLICATIONS

Bien, D C, et al. "Characterization of Masking Materials for Deep Glass Micromachining." Journal of Micromechanics and Microengineering, vol. 13, No. 4, 2003, https://doi.org/10.1088/0960-1317/13/4/305. (Year: 2003).*

* cited by examiner

*Primary Examiner* — J. E. Schoenholtz
(74) *Attorney, Agent, or Firm* — Lewis Roca Rothgerber Christie LLP

(57) ABSTRACT

In a method of fabricating a cover window, the method includes: forming, on a glass article having a flat upper surface, a mask layer including water glass and a recess portion having a partially recessed upper surface; and etching the mask layer and the glass article to form a cover window having a partially recessed upper surface.

20 Claims, 16 Drawing Sheets

METHOD OF FABRICATING COVER WINDOW, COVER WINDOW AND DISPLAY DEVICE INCLUDING THE SAME

CROSS-REFERENCE TO RELATED APPLICATION

This application claims priority to and the benefit of Korean Patent Application No. 10-2020-0067162 filed on Jun. 3, 2020 in the Korean Intellectual Property Office, the contents of which in its entirety are herein incorporated by reference.

BACKGROUND

1. Field

Aspects of some example embodiments of the present disclosure relate to a method of fabricating a cover window, a cover window and a display device including the same.

2. Description of the Related Art

The importance of display devices has steadily increased with the development of multimedia technology. Accordingly, various types of display devices such as an organic light emitting display (OLED), a liquid crystal display (LCD) and the like have been used.

Meanwhile, a cover window may be utilized in construction materials or electronic devices including display devices. For example, the cover window may be utilized to protect a flat panel display device such as an LCD and an OLED, or a substrate of the flat panel display device.

In recent years, foldable display devices have been researched for user convenience. It may be desirable for a cover window applied to the foldable display device to have a relatively thin thickness to alleviate bending stress caused when folded.

The above information disclosed in this Background section is only for enhancement of understanding of the background and therefore the information discussed in this Background section does not necessarily constitute prior art.

SUMMARY

Aspects of some example embodiments of the present disclosure relate to a method of fabricating a cover window, a cover window and a display device including the same. For example, some example embodiments of the present disclosure relate to a method of fabricating a cover window partially including a slimming area using water glass and a cover window fabricated by the same.

Aspects of the present disclosure provide a method of fabricating a cover window partially including a slimming portion having a recessed shape using water glass.

Aspects of the present disclosure also provide a cover window capable of preventing a slimming portion from being visible from the outside using the above method and a display device including the same.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

In a method of fabricating the cover window according to some example embodiments, it may be possible to fabricate the cover window partially including the slimming portion according to the shape of water glass by using a method of etching a glass article using water glass. In the cover window fabricated by the method, the slimming portion having the recessed shape can be invisible from the outside, and the cover window can be used in a foldable display, thereby improving the visibility of the display device.

The characteristics of embodiments according to the present disclosure are not limited to the aforementioned effects, and various other effects are included in the present specification.

According to some example embodiments of the present disclosure, in a method of fabricating a cover window, the method comprises: preparing a glass article having a flat upper surface; forming, on the glass article, a mask layer including water glass and a recess portion having a partially recessed upper surface; and etching the mask layer and the glass article to form a cover window whose upper surface is partially recessed.

According to some example embodiments, the forming of the mask layer may comprise coating a water glass layer on the upper surface of the glass article and etching a portion of an upper surface of the water glass layer to from the mask layer.

According to some example embodiments, the mask layer may include the recess portion and a flat portion having a flat upper surface, which is connected to the recess portion, and a thickness of the recess portion may be smaller than a thickness of the flat portion.

According to some example embodiments, the recess portion may include a first portion having a flat upper surface and a second portion connecting the first portion to the flat portion and having an inclined upper surface.

According to some example embodiments, the recess portion may have a curved upper surface.

According to some example embodiments, the forming of the cover window may be performed by a wet etching process.

According to some example embodiments, in the forming of the cover window, the mask layer may be dissolved by an etchant and the upper surface of the glass article is partially etched.

According to some example embodiments, in the glass article, a portion corresponding to the recess portion of the mask layer may be etched to have a curved upper surface, and a portion corresponding to an area other than the recess portion may be etched to have a flat upper surface.

According to some example embodiments, the mask layer and the glass article may be over-etched by wet etching.

According to some example embodiments, a maximum thickness of the cover window may be smaller than a thickness of the glass article.

According to some example embodiments, the cover window may include a first surface and a second surface that is flat and opposite to the first surface, and further include a non-slimming portion in which the first surface is flat and a slimming portion in which the first surface is partially recessed, wherein the slimming portion may have a thickness smaller than that of the non-slimming portion.

According to some example embodiments, a portion of the first surface where the slimming portion is located may have a curved shape.

According to some example embodiments, a first thickness of the non-slimming portion may have a range of 0.1 mm to 20 mm, and a second thickness of the slimming portion may have a range of 0.01 mm to 0.1 mm.

According to some example embodiments, a width of the slimming portion may have a range of 20 mm or less.

According to some example embodiments, the cover window may be folded such that the first surface faces inward with respect to a folding line placed in the slimming portion.

According to some example embodiments of the present disclosure, in a cover window including a first surface and a second surface that is flat and opposite to the first surface and being folded such that the first surface faces inward with respect to a folding line, the cover window comprises a non-slimming portion in which the first surface is flat and a slimming portion in which the first surface is partially recessed and having a thickness smaller than that of the non-slimming portion, wherein the folding line being located in the slimming portion.

According to some example embodiments, a first thickness of the non-slimming portion may have a range of 0.1 mm to 20 mm, and a second thickness of the slimming portion may have a range of 0.01 mm to 0.1 mm.

According to some example embodiments, a width of the slimming portion may have a range of 20 mm or less.

According to some example embodiments, a length measured from the slimming portion to a center of curvature of the first surface in a state of being folded with respect to the folding line may have a range of about 2 mm.

According to some example embodiments of the present disclosure, an in-foldable display device, which is configured to be folded such that a display surface faces inward, the display device comprises a display panel including one surface located on a front side and the other surface located on a rear side and displaying a screen on the front side, a cover window on the one surface of the display panel and including a first surface and a second surface which is flat and opposite to the first surface, and a bonding member between the second surface of the cover window and the display panel, wherein the cover window includes a non-slimming portion in which the first surface is flat and a slimming portion in which the first surface is partially recessed and having a thickness smaller than that of the non-slimming portion.

BRIEF DESCRIPTION OF THE DRAWINGS

The above and other aspects and characteristics of embodiments the present disclosure will become more apparent by describing in more detail aspects of some example embodiments thereof with reference to the attached drawings, in which.

DETAILED DESCRIPTION

Aspects of some example embodiments of the present invention will now be described more fully hereinafter with reference to the accompanying drawings, in which some example embodiments of the invention are shown. This invention may, however, be embodied in different forms and should not be construed as limited to the embodiments set forth herein. Rather, these embodiments are provided so that this disclosure will be more thorough and more complete, and will more fully convey the scope of embodiments according to the present invention to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present invention. Similarly, the second element could also be termed the first element.

Hereinafter, aspects of some example embodiments will be described with reference to the accompanying drawings.

Figure 1:
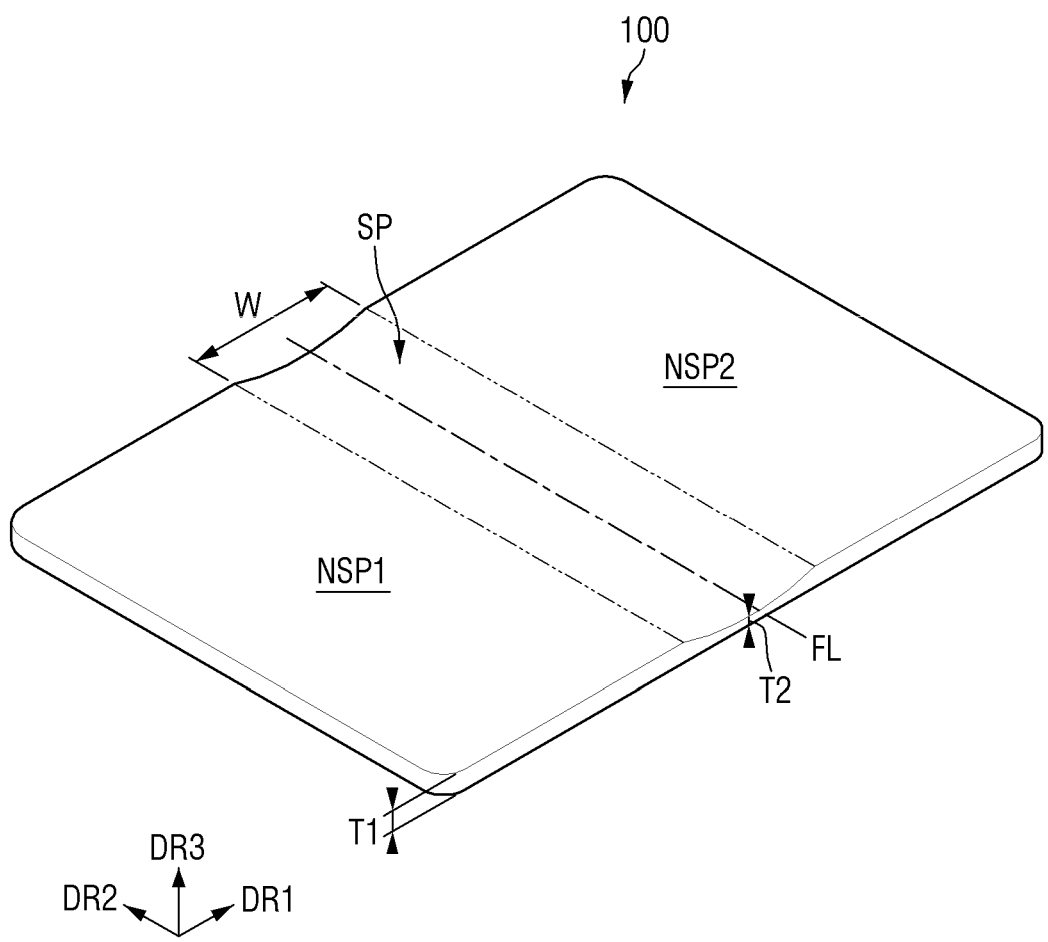
FIG. 1 is a schematic perspective view of a cover window according to some example embodiments.
Figure 2:
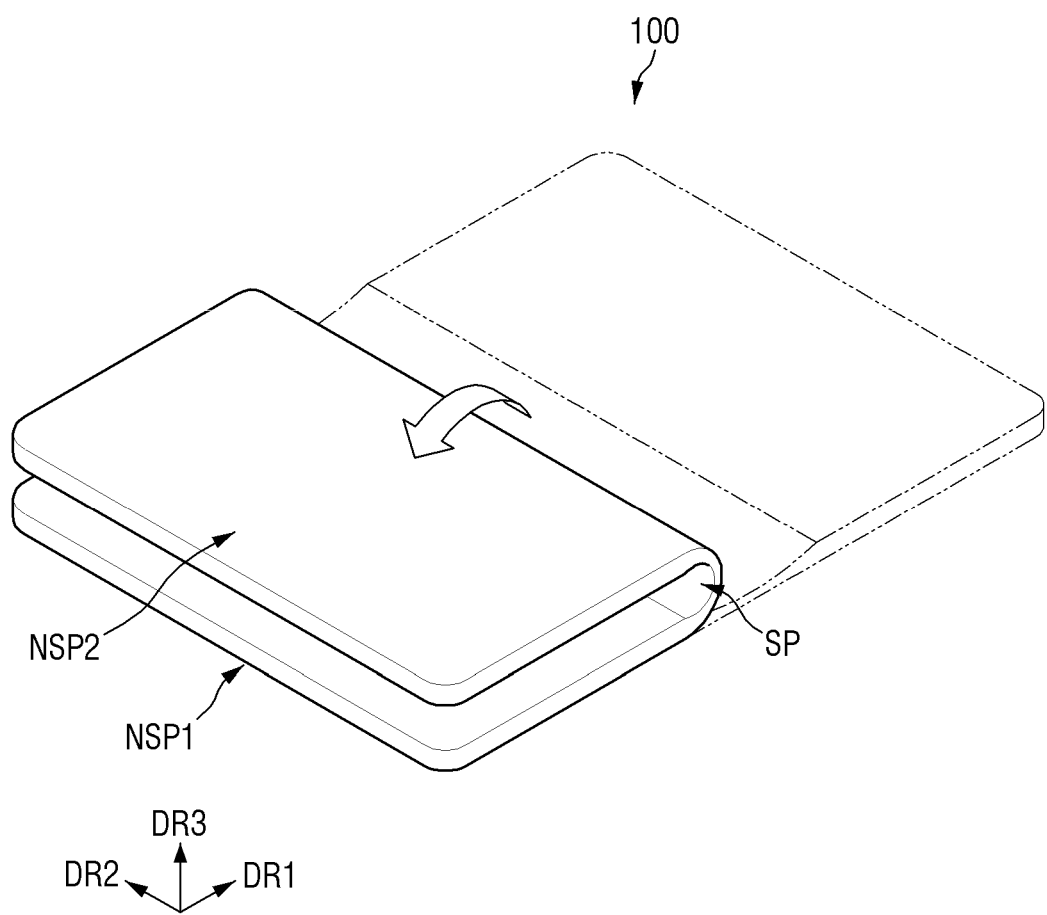
FIG. 2 is a perspective view showing a folded state of the cover window of FIG. 1 according to some example embodiments.
Figure 3:
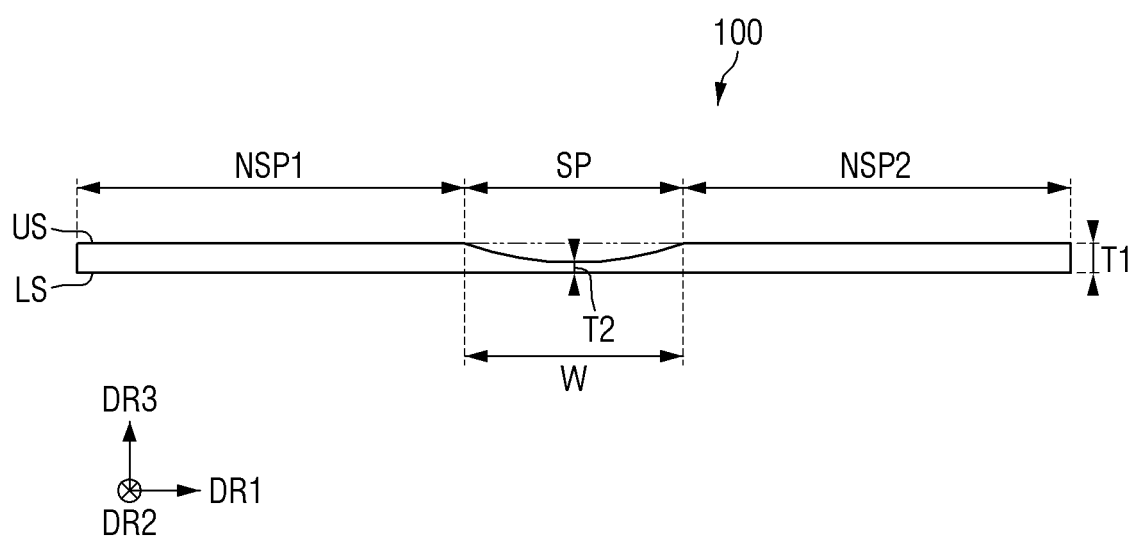
FIG. 3 is a side view of a cover window according to some example embodiments.

FIG. 1 is a schematic perspective view of a cover window according some example embodiments. FIG. 2 is a perspective view showing a folded state of the cover window of FIG. 1. FIG. 3 is a side view of a cover window according some example embodiments.

The terms "above," "top" and "upper surface" as used herein refer to an upward direction (i.e., one side of a third direction DR3) with respect to the cover window 100. The terms "below," "bottom" and "lower surface" as used herein refer to the other side of the third direction DR3. Further, "left," "right," "upper," and "lower" indicate directions when the cover window 100 is viewed from above. For example, "left" indicates one side of the first direction DR1, "right" indicates the other side of the first direction DR1, "upper" indicates one side of the second direction DR2, and "lower" indicates the other side of the second direction DR2.

Referring to FIGS. 1 to 3, the cover window 100 is used to protect a display of an electronic device or display device (e.g., the display device 10 shown in FIG. 14), such as a refrigerator and a washing machine which have display screens, as well as a tablet PC, a notebook PC, a smart phone, an electronic book, a television, and a PC monitor. The cover window 100 may also be employed as a cover glass for a dashboard of a vehicle, a cover glass for solar cells, interior materials for construction materials, windows for buildings and houses, and the like.

According to some example embodiments, the cover window 100 may be in the form of a flat sheet or flat plate. The planar shape of the cover window 100 may be a rectangular shape, but embodiments are not limited thereto, and the cover window 100 may have various shapes such as a rectangular shape with rounded corners, a square shape, a circular shape, an elliptical shape, or any other suitable shape according to the design of the corresponding electronic device. According to some example embodiments, the cover window 100 may have a three-dimensional shape including bent portions. For example, the edges of a flat portion may be bent or entirely curved. Further, according to some example embodiments, the cover window 100 has flexibility so that it can be folded with respect to a folding line F L.

The cover window 100 includes a first surface US and a second surface LS that is an opposite surface to the first surface US. The first surface US may be the upper surface of the cover window 100, and the second surface LS may be the lower surface of the cover window 100. The cover window 100 may have a rectangular shape in a plan view (e.g., a view perpendicular normal with respect to a plane or display surface), and each portion where the sides respectively extending in the first direction DR1 and the second direction DR2 meet may have a curved shape. The first surface US and the second surface LS are opposed to each other in the thickness direction. When the cover window 100 is included in a display device 10 (see FIG. 14) and serves to transmit light, the light may enter mainly one of the first surface US and the second surface LS to be transmitted through the other one. The drawing illustrates the case where the sides of the cover window 100 extending in the first direction DR1 are longer than the sides of the cover window 100 extending in the second direction DR2, but embodiments according to the present disclosure are not limited thereto.

The cover window 100 may have a relatively strong strength. For example, when glass is employed as a window, the cover window may have a relatively small thickness in order to provide a relatively high level of transmittance while also having a relatively light weight, and also having a relatively high strength such that the cover window 100 is not easily broken by the impact of an external object.

According to some example embodiments, the cover window 100 includes a glass composition. The glass composition of the cover window 100 may include various compositions known in the art. According to some example embodiments, the glass composition may include, for example, LAS glass ceramics containing lithium aluminosilicate. For example, the glass composition may contain 50 to 80 mol % of $SiO_2$, 1 to 30 mol % of $Al_2O_3$, 0 to 5 mol % of $B_2O_3$, 0 to 4 mol % of $P_2O_5$, 3 to 20 mol % of $Li_2O$, 0 to 20 mol % of $Na_2O$, 0 to 10 mol % of $K_2O$, 3 to 20 mol % of MgO, 0 to 20 mol % of CaO, 0 to 20 mol % of SrO, 0 to 15 mol % of BaO, 0 to 10 mol % of ZnO, 0 to 1 mol % of $TiO_2$, and 0 to 8 mol % of $ZrO_2$.

The term "the content is 0 mol %" as used herein means that it does not substantially contain the corresponding component. The term "(composition) does not substantially contain (a certain component)" as used herein means that the certain component is not intentionally contained in raw materials and the like, and includes, for example, a case in which a tiny amount (e.g., 0.1 mol % or less) of impurities are inevitably contained.

In more detail with respect to each component of the glass composition, $SiO_2$ constitutes the skeleton of glass, may increase the chemical durability, and may serve to reduce the occurrence of cracks when scratches (indentations) are made on the glass surface. In order to fully perform this role, $SiO_2$ may be contained in an amount of 50 mol % or more. In order to exhibit sufficient meltability, $SiO_2$ in the glass composition may have a content of up to 80 mol %.

$Al_2O_3$ serves to improve the breakage resistance of glass. That is, $Al_2O_3$ may serve to generate a smaller number of fragments when the glass is broken. In addition, $Al_2O_3$ may serve as an active component that improves ion exchange performance during chemical strengthening and increases surface compressive stress after strengthening. When the content of $Al_2O_3$ is 1 mol % or more, the above-described function can be effectively performed. Meanwhile, in order to maintain the acid resistance and meltability of glass, the content of $Al_2O_3$ is preferably 30 mol % or less.

$B_2O_3$ enhances the chipping resistance of glass and improves the meltability of glass. $B_2O_3$ may not be contained (0 mol %), but may further improve the meltability of glass when contained in an amount of 0.5 mol % or more. $B_2O_3$ in a content of 5 mol % or less may suppress the occurrence of striae during melting.

$P_2O_5$ improves the ion exchange performance and chipping resistance. $P_2O_5$ may not be contained (0 mol %), but may significantly perform the above-described function when contained in an amount of 0.5 mol % or more. $P_2O_5$ in a content of 4 mol % or less may prevent a significant decrease in breakage resistance and acid resistance.

$Li_2O$ serves to form surface compressive stress by ion exchange. Li ions near the glass surface may be exchanged with Na ions or the like through an ion exchange process. $Li_2O$ may also serve to improve the breakage resistance of glass. The content of $Li_2O$ for effective ion exchange is 3 mol % or more, and the content of $Li_2O$ is preferably 20 mol % or less in terms of acid resistance.

$Na_2O$ serves to form surface compressive stress by ion exchange and improve the meltability of glass. Na ions near the glass surface may be exchanged with K ions or the like through an ion exchange process. $Na_2O$ may not be contained, but if contained, the content of $Na_2O$ is preferably 1 mol % or more to effectively perform the above-described role. If there is only a Li and Na ion exchange process and no K ion exchange process, it may be preferable that the content of $Na_2O$ is 8 mol % or less for smooth Li and Na ion exchange. If a K ion exchange process is also performed, a larger amount of $Na_2O$ may be used. However, also in this case, it may be preferable that the content of $Na_2O$ is 20 mol % or less in terms of acid resistance.

$K_2O$ improves the ion exchange performance and is associated with the breakage resistance. $K_2O$ may not be contained, but may be contained in an amount of 0.5 mol % or more to improve the ion exchange performance. In order to prevent an excessive decrease in breakage resistance, the content of $K_2O$ may be 10 mol % or less.

MgO serves to increase the surface compressive stress and improve the breakage resistance of chemically strengthened glass. This role can be effectively performed when the content of MgO is 3 mol % or more. MgO in a content of 20 mol % or less may reduce the occurrence of devitrification during glass melting.

CaO serves to improve the meltability and breakage resistance of glass. CaO may not be contained, and in order to effectively perform this role, CaO is preferably contained in a content of 0.5 mol % or more. If the content of CaO is excessively high, the ion exchange performance may be degraded, and thus, the content of CaO is preferably 20 mol % or less.

SrO serves to improve the meltability and breakage resistance of glass, similarly to CaO. SrO may not be contained, and in order to effectively perform this role, SrO is preferably contained in a content of 0.5 mol % or more.

If the content of SrO is excessively high, the ion exchange performance may be degraded, and thus, the content of SrO is preferably 20 mol % or less.

BaO serves to improve the meltability and breakage resistance of glass. BaO may not be contained, and in order to effectively perform this role, BaO is preferably contained in a content of 0.5 mol % or more. BaO in a content of 15 mol % or less may enable preventing or reducing an excessive decrease in ion exchange performance.

ZnO serves to improve the meltability of glass. ZnO may not be contained, and may significantly exhibit the effect of improving meltability when contained in a content of 0.25 mol % or more. In order to prevent or reduce a decrease in weatherability, the content of ZnO is preferably 10 mol % or less.

$TiO_2$ improves the breakage resistance of chemically strengthened glass. $TiO_2$ may not be contained, and may significantly exhibit the effect of improving breakage resistance when contained in a content of 0.1 mol % or more. In order to prevent devitrification during melting, the content of $TiO_2$ is preferably 1 mol % or less.

$ZrO_2$ may increase the surface compressive stress due to ion exchange and improve the breakage resistance of glass. $ZrO_2$ may not be contained, and may effectively perform this role when contained in a content of 0.5 mol % or more. $ZrO_2$ in a content of 8 mol % or less may suppress devitrification during melting.

The glass composition may further include components such as $Y_2O_3$, $La_2O_3$, $Nb_2O_5$, $Ta_2O_5$ and $Gd_2O_3$, if necessary, in addition to the components mentioned above. The composition ratio of the glass composition of the cover window 100 may be changed through a molding process or an ion exchange process.

According to some example embodiments, the cover window 100 may have flexibility, and thus the cover window 100 may be foldable. The term "foldable" is used herein to cover not only a folded device but also a device that can have both a folded state and an unfolded state. Further, the folding may typically include folding at an angle of about 180 degrees. However, embodiments according to the present disclosure are not limited thereto, and according to some example embodiments, the folding angle may exceed 180 degrees or may be less than 180 degrees, for example, a case where the folding angle is equal to or greater than 90 degrees and less than 180 degrees, or a case where the folding angle is equal to or greater than 120 degrees and less than 180 degrees. In addition, it may be referred to as a folded state if folding is performed out of the unfolded state, even if complete folding is not performed. For example, even if it is folded at an angle of 90 degrees or less, as long as the maximum folding angle becomes 90 degrees or more, it may be expressed as being in a folded state to distinguish it from the unfolded state.

The cover window 100 may be folded with respect to the folding line FL. The folding line FL may have a straight linear shape extending in one direction, for example, the second direction DR2 on the plane. Although the drawing illustrates an embodiment in which the folding line FL extends parallel to the short side of the cover window 100, the present disclosure is not limited thereto. The folding line FL may be parallel to the long side or may be inclined with respect to the short side and the long side.

In some example embodiments, the folding line FL of the cover window 100 may be determined at a specific location. One or two or more folding lines FL may be determined at a specific location(s) in the cover window 100. According to some example embodiments, the location of the folding line FL may not be specified in the cover window 100 and may be freely set in various areas.

Further, as described above, the cover window 100 may have a strength of a level (e.g., a set or predetermined level) or higher to protect an electronic device including a display, but it may also have flexibility to be folded with respect to the folding line FL. The strength and foldability of the cover window 100 may be related to the thickness of the cover window 100. When the thickness is large, the mechanical strength of the cover window 100 may be secured, but the flexibility may be somewhat reduced. On the contrary, when the thickness of the cover window 100 is small, the cover window 100 may be smoothly folded as it has flexibility. However, it may be difficult to secure the mechanical strength to protect the electronic device and the like. In consideration of these characteristics, the cover window 100 according some example embodiments may include a thin slimming portion SP as a peripheral portion of the folding line FL, and thick non-slimming portions NSP1 and NSP2 as portions other than the slimming portion SP, in which the folding line FL is not formed.

The slimming portion SP as the peripheral portion of the folding line FL may be arranged such that the folding line FL is located at the center of the slimming portion SP. According to some example embodiments, the slimming portion SP may gradually (e.g., with a sloped or curved shape) become thinner from the non-slimming portions NSP1 and NSP2 toward the folding line FL, such that the thickness of the cover window is smallest along the folding line FL. The first surface US of the cover window 100 is partially recessed in the slimming portion SP, so that the slimming portion SP may have a recessed shape. The slimming portion SP may be formed to have a thin thickness to correspond to an area where the cover window 100 is configured to be folded. According to some example embodiments, the first surface US may have the recessed shape with curvature in the slimming portion SP. The slimming portion SP may have a shape such that its thickness is gradually reduced toward the folding line FL compared to the thicknesses of the non-slimming portions NSP1 and NSP2. The first surface US has a gently recessed shape in the slimming portion SP, so that the cover window 100 can become more resistant to compressive stress caused by folding and portions of the first surface US can be prevented from being in direct contact with each other when the cover window 100 is folded.

The cover window 100 may be divided into the first non-slimming portion NSP1 and the second non-slimming portion NSP2 with respect to the slimming portion SP. The first non-slimming portion NSP1 may be located on one side (e.g., left side) of the folding line FL, and the second non-slimming portion NSP2 may be located on the other side (e.g., right side) of the folding line FL. When the folding line FL has been determined at a specific position, the first and second non-slimming portions NSP1 and NSP2 may be specified as areas where folding is not performed. The first and second non-slimming portions NSP1 and NSP2 may have the same width, but the present disclosure is not limited thereto. When the folding line FL has not been specified, the areas of the first and second non-slimming portions NSP1 and NSP2 may vary according to a position where the folding line FL is set. The first surface US may be flat on the first and second non-slimming portions NSP1 and NSP2, so that the first and second non-slimming portions NSP1 and NSP2 can have uniform thicknesses. Each of the non-slimming portions NSP1 and NSP2, which is an area not to be folded at a distance from the folding line FL, may have a certain level of thickness, thereby securing durability against external impacts. That is, in the cover window 100, the first surface US is formed to be partially recessed or flat according to the position, whereas the second surface LS is formed to be flat regardless of the position, so that the slimming portion SP and the non-slimming portions NSP1 and NSP2 may have different thicknesses.

Figure 4:
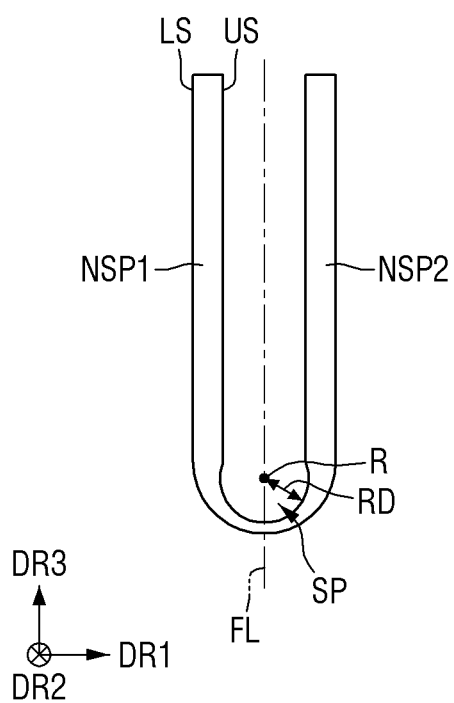
FIG. 4 is a cross-sectional view illustrating a slimming portion when a cover window is in a folded state according to some example embodiments.

FIG. 4 is a cross-sectional view illustrating a slimming portion when a cover window according some example embodiments is in a folded state.

Referring to FIG. 4 in conjunction with FIGS. 1 to 3, the cover window 100 may be folded in an in-folding manner in which the first surface US is folded inward such that the inside surfaces face each other, or folded in an out-folding manner in which the first surface US is folded outward. The cover window 100 may be folded in only one manner, i.e., the in-folding manner or out-folding manner. Alternatively, both the in-folding and the out-folding may be performed. In the case of the cover window 100 in which both in-folding and out-folding are performed, in-folding and out-folding may be performed with respect to the same folding line FL. Alternatively, it may include a plurality of folding lines FL, such as a folding line FL for in-folding only and a folding line FL for out-folding only, which are used to perform different types of folding.

A thickness T1, T2 of the cover window 100 is defined as a distance between the first surface US and the second surface LS. According to some example embodiments, the first thickness T1 of the non-slimming portion NSP1, NSP2 of the cover window 100 may be in a range of 0.1 mm to 2 mm. The cover window 100 may have at least a certain level of durability against external impacts as the non-slimming portions NSP1 and NSP2 that are not folded have thicknesses in the above-described range, particularly at least 0.1 mm or more.

On the other hand, the slimming portion SP of the cover window 100 may have the second thickness T2, as the minimum thickness thereof, in a range of 0.01 mm to 0.1 mm, and a width W in a range of 1 mm to 20 mm. The slimming portion SP, which is an area folded with respect to the folding line FL, may have a relatively thin thickness so that it can be smoothly folded. The thickness of the slimming portion SP may be 0.1 mm or less, and preferably in a range of 0.01 mm to 0.03 mm, so that the cover window 100 can have a somewhat reduced repulsive force caused in the slimming portion SP due to folding. A depth of the slimming portion SP where the first surface US is partially recessed may be in a range of 0.07 mm to 0.1 mm. When the cover window 100 is folded, a radius RD of curvature measured from a center R of curvature to the first surface US of the cover window 100 may be 5 mm or less, and preferably in a range of 1 mm to 2 mm. Because the cover window 100 according some example embodiments includes the slimming portion SP and non-slimming portions NSP1 and NSP2 which have different thicknesses, it may be possible to enable both the flexibility for smooth folding and the durability against external impacts in the non-slimming portions NSP1 and NSP2.

Meanwhile, as described above, the cover window 100 including the slimming portion SP may be fabricated through a molding process of preparing a glass article having flat surfaces and etching one surface of the glass article. The molding process of the glass article may be performed by a method of etching or pressing a portion or area of the cover window 100 to form the slimming portion SP. In this case, the boundaries between the slimming portion SP and the non-slimming portions NSP1 and NSP2 may be visible from the outside. In order to prevent or reduce the visibility of boundaries between the slimming portion SP and the non-slimming portions NSP1 and NSP2, the method of fabricating the cover window 100 according some example embodiments may be performed through a process of etching the glass article using water glass which has similar components to the glass composition. The cover window 100 is fabricated by performing the process of etching the glass article together using water glass, thereby simplifying the fabrication process and preventing the slimming portion SP of the cover window 100 from being visible from the outside.

Hereinafter, a method of fabricating the cover window 100 according some example embodiments will be described with reference to other drawings.

Figure 5:
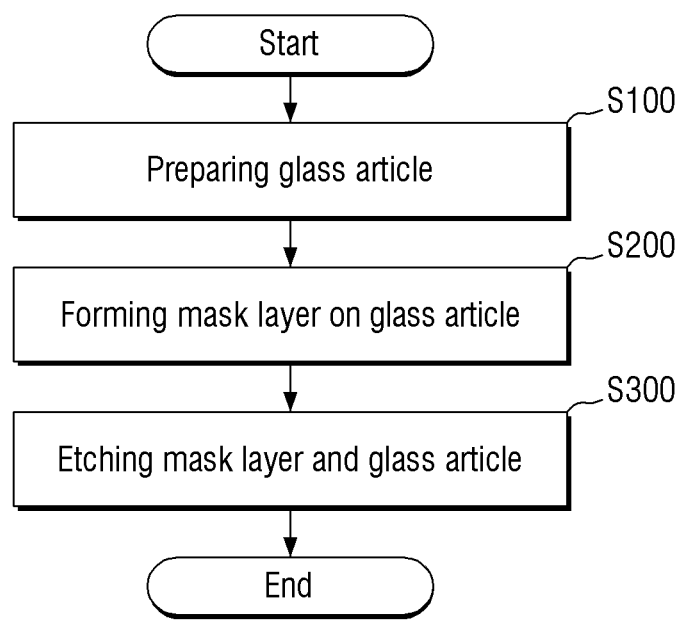
FIG. 5 is a flowchart showing a method of fabricating a cover window according to some example embodiments.

FIG. 5 is a flowchart showing a method of fabricating a cover window according some example embodiments.

Referring to FIG. 5, the method of fabricating the cover window 100 according some example embodiments may include preparing a glass article (operation S100), forming a mask layer on the glass article (operation S200), and etching the mask layer and the glass article (operation S300). The glass article may contain a glass composition to form the cover window 100 after the etching process.

FIGS. 6 to 11 are cross-sectional views of a cover window for sequentially illustrating a fabrication process of the cover window according some example embodiments.

Figure 6:
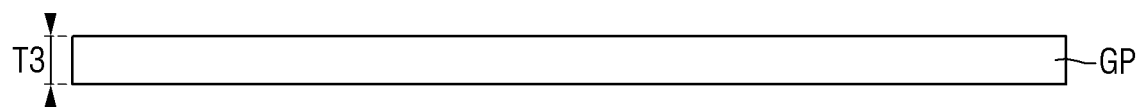
FIGS. 6 to 11 are cross-sectional views of a cover window for sequentially illustrating a fabrication process of the cover window according to some example embodiments.

First, referring to FIG. 6, a glass article GP containing a glass composition is prepared (operation S100). The glass article GP may have a plate shape whose upper surface is flat.

The glass article GP may have the composition of the cover window 100 described above. According to some example embodiments, the glass article GP may include LAS glass ceramics containing lithium aluminosilicate. For example, the glass composition may contain 50 to 80 mol % of $SiO_2$, 1 to 30 mol % of $Al_2O_3$, 0 to 5 mol % of $B_2O_3$, 0 to 4 mol % of $P_2O_5$, 3 to 20 mol % of $Li_2O$, 0 to 20 mol % of $Na_2O$, 0 to 10 mol % of $K_2O$, 3 to 20 mol % of MgO, 0 to 20 mol % of CaO, 0 to 20 mol % of SrO, 0 to 15 mol % of BaO, 0 to 10 mol % of ZnO, 0 to 1 mol % of $TiO_2$, and 0 to 8 mol % of $ZrO_2$. The term "the content is 0 mol %" as used herein means that it does not substantially contain the corresponding component. The term "(composition) does not substantially contain (a certain component)" as used herein means that the certain component is not intentionally contained in raw materials and the like, and includes, for example, a case in which a tiny amount (e.g., 0.1 mol % or less) of impurities are inevitably contained. A description of each component of the glass article GP is the same as described above. The glass article GP may further include components such as $Y_2O_3$, $La_2O_3$, $Nb_2O_5$, $Ta_2O_5$ and $Gd_2O_3$, if necessary, in addition to the components mentioned above.

In some embodiments, the glass article GP may be fabricated through a molding operation, a cutting operation, a chamfering operation, a healing operation, a high temperature/high humidity treatment operation, and a chemical strengthening operation of the glass composition.

For example, the molding operation of the glass composition may be a operation of preparing a glass composition having the above-described composition, and molding it to have a specific shape. The glass composition described above may be molded into a plate shape by various methods known in the art. For example, it may be molded by a float process, a fusion draw process, a slot draw process, or the like. However, the present disclosure is not limited thereto.

Then, the molded glass composition may be cut through the cutting operation. The glass composition molded into a plate shape may have a different size than that of the glass article GP. For example, molding of the glass composition may be performed to form a large-area substrate as a mother glass including a plurality of glass compositions. The mother glass may be cut into a plurality of cells to produce a plurality of glass compositions. For example, even though the glass article GP has a size of about 6 inches, when a glass composition is molded to have a size of several to several hundred times, e.g., 120 inches and then cut, 20 glass compositions molded into a plate shape can be obtained at the same time. The cutting process of the glass composition may be performed using a cutting knife, a cutting wheel, a laser, or the like. However, the present disclosure is not limited thereto.

Subsequently, the cut glass composition is subjected to the chamfering process. The chamfering process is performed to form a chamfered surface of each cut glass composition in a laminated structure state in which the cut glass composition and the cut dummy substrate are bonded via an adhesive layer. The chamfering process of the cut glass composition may be performed through computerized numerical control (CNC). By chamfering the cut glass composition, it may be possible to prevent or reduce chipping or breaking of the cut surface of the glass composition.

The chamfered glass composition is then healed or surface-treated. By surface-treating the chamfered glass composition, it is possible to improve the reduced strength of the side surface of the glass composition. The surface treatment process of the chamfered glass composition may be performed using a surface treatment solution containing fluorine ions. In some example embodiments, a polishing process of the glass composition may be further performed between the chamfering process and the surface treatment process.

Subsequently, the surface-treated glass composition is subjected to the high temperature/high humidity treatment. The high temperature/high humidity treatment process may be performed on the surface-treated glass composition in a chamber, which is controlled at a temperature condition ranging from 80° C. to 90° C., and a humidity condition ranging from 80% to 90%, for about 2 hours to 4 hours.

Subsequently, the glass composition is chemically strengthened to form the glass article GP. The chemically strengthening operation may be performed through an ion exchange process, and the glass article GP thus formed may have excellent durability, strength, or compressive stress. The above-described processes are performed to secure sufficient durability of the glass article GP, but are not necessarily limited thereto. A preceding process for adjusting the characteristics of the glass article GP may be performed according to a product to which the cover window 100 is applied.

Figure 7:
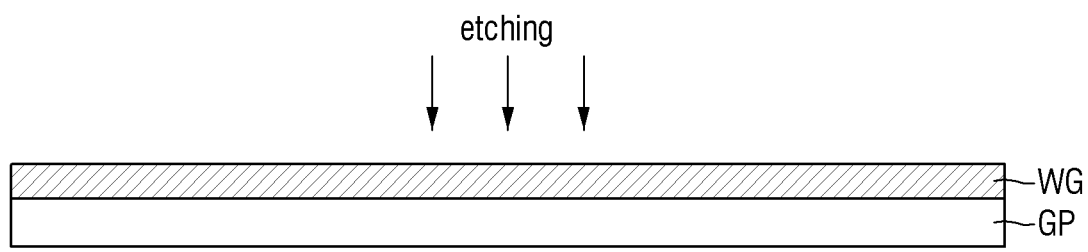
Figure 8:
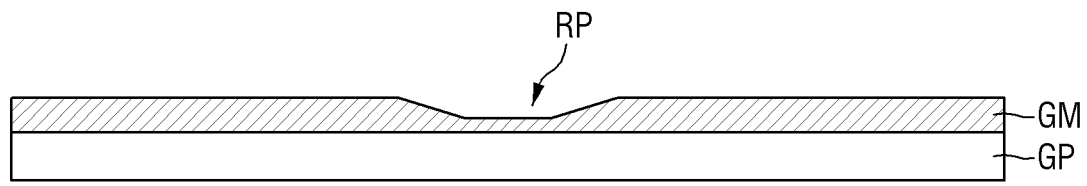

Then, referring to FIGS. 7 and 8, a mask layer GM is formed on the glass article GP (operation S200). According to some example embodiments, the mask layer GM may include water glass. As the mask layer GM includes water glass, water glass may also be removed together by an etchant used in the etching process of the glass article GP. Compared to the conventional patterning process using a mask, because a mask removal process is omitted, the fabrication process can be reduced. In addition, the mask layer GM including water glass is coated on the glass article GP to perform the etching process according to an etching selectivity, thereby forming the glass article GP in a desired shape.

That is, the mask layer GM may have a structure for etching the glass article GP according to the shape of the cover window 100. For example, the mask layer GM may include flat portions having flat upper surfaces and a recess portion RP having a partially recessed upper surface. When the mask layer GM and the glass article GP are simultaneously etched in a subsequent process, a portion of the glass article GP corresponding to the recess portion RP may be formed as the slimming portion SP of the cover window 100, and portions of the glass article GP corresponding to the flat portions may be formed as the non-slimming portions NSP1 and NSP2 of the cover window 100. The flat portions of the mask layer GM, as portions having uniform thicknesses and flat upper surfaces, may be separated by the recess portion RP. The recess portion RP, as a portion having the partially recessed upper surface, may have a thickness smaller than the thicknesses of the flat portions.

The mask layer GM may be formed by coating a water glass layer WG on the glass article GP, and then etching only a portion of the upper surface of the water glass layer WG. The mask layer GM may have the recess portion RP which has been formed by partially etching the water glass layer WG, and the portions other than the recess portion RP may have different thicknesses. The drawing illustrates that the mask layer GM is formed by etching the water glass layer WG without an additional mask, but the present disclosure is not limited thereto.

According to some example embodiments, the recess portion RP of the mask layer GM may include a first portion having a flat upper surface and second portions having inclined upper surfaces. The second portion of the recess portion RP which has the inclined upper surface connects the flat portion of the mask layer GM to the first portion of the recess portion RP which has the flat upper surface. In the mask layer GM, the recess portion RP may have a linear angular shape on the whole, but is not limited thereto. The upper surface of the mask layer GM may be partially recessed with a curvature so that the recess portion RP can be formed in a gently curved shape.

Because the mask layer GM has the upper surface recessed in the recess portion RP, the thickness of the recess portion RP may be smaller than the thicknesses of other portions. The etching amount of the glass article GP that is etched together with the mask layer GM may vary according to the position. A portion of the glass article GP corresponding to the recess portion RP of the mask layer GM may be etched more than other portions, and the portion may form the slimming portion SP of the cover window 100.

Figure 9:
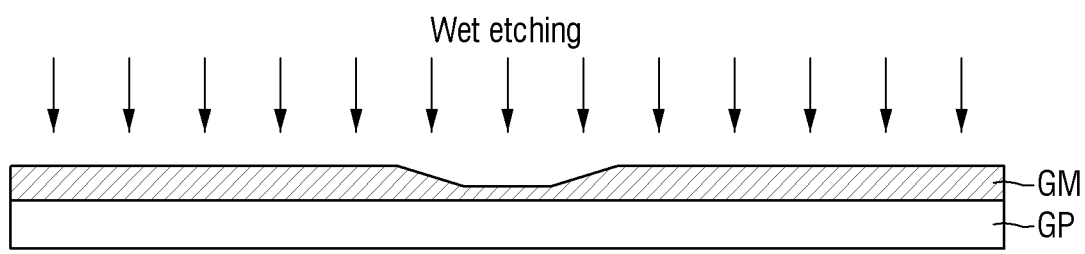
Figure 10:
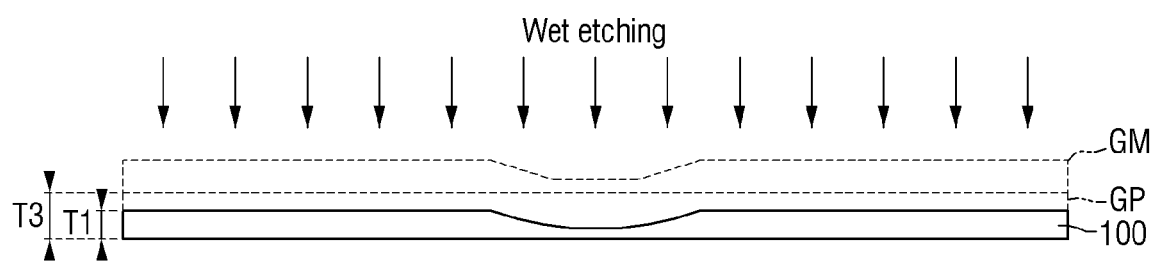

Next, referring to FIGS. 9 and 10, the mask layer GM and the glass article GP are simultaneously etched (operation S300) to fabricate the cover window 100. The mask layer GM includes water glass so that it can be removed by being dissolved in the etchant for etching the glass article GP. The mask layer GM is dissolved and removed while portions of the glass article GP are etched at different rates to correspond to the recess portion RP of the mask layer GM. By etching the glass article GP using the mask layer GM including water glass, one operation may be reduced from the operations of the fabrication process of the cover window 100.

According to some example embodiments, the etching process performed on the mask layer GM and the glass article GP may be an over-etching process. As the glass article GP is etched together with the mask layer GM through the over-etching process, the finally fabricated cover window 100 may have the non-slimming portions NSP1 and NSP2 whose first thickness T1 is smaller than a third thickness T3 of the glass article GP. The entire surface of the glass article GP may be etched according to the shape of the mask layer GM, and the slimming portion SP may be formed in a portion where the recess portion RP is located, and the non-slimming portions NSP1 and NSP2 may be formed in other portions. The cover window 100 fabricated using the mask layer GM including water glass may be formed to have the slimming portion SP in which the first surface US is partially recessed by controlling the etching selectivity according to the shape of the mask layer GM.

According to some example embodiments, the etching process of the mask layer GM and the glass article GP may be a wet etching process, and the portion of the glass article GP, which corresponds to the recess portion RP of the mask layer GM, may be isotropically etched.

Figure 11:
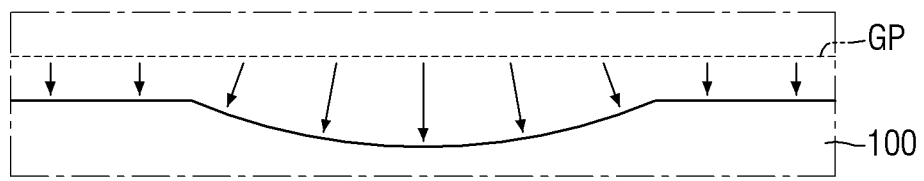

FIG. 11 schematically illustrates forming the slimming portion SP by etching a portion of the glass article GP corresponding to the recess portion RP of the mask layer GM. Referring to FIG. 11, in the cover window 100 formed by etching the glass article GP, the slimming portion SP in which the upper surface is partially recessed with curvature, and the flat non-slimming portions NSP1 and NSP2 may be formed. Although the recess portion RP of the mask layer GM has the linear angular shape on the whole, a portion of the first surface US of the cover window 100, which corresponds to the slimming portion SP, may have a gently curved shape through the wet etching.

However, the present disclosure is not limited thereto, and the recess portion RP of the mask layer GM may have a gently curved shape corresponding to the shape of the slimming portion SP of the cover window 100.

Figure 12:
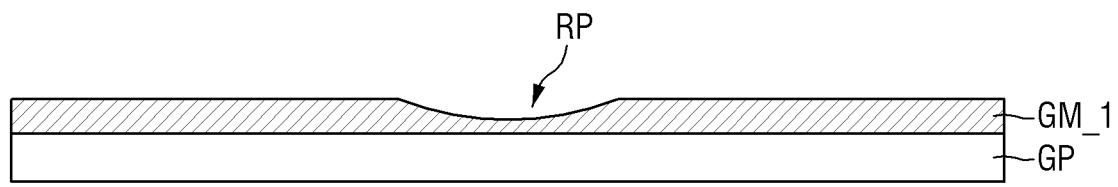
FIGS. 12 and 13 are cross-sectional views sequentially illustrating a fabrication process of a cover window according to some example embodiments.
Figure 13:
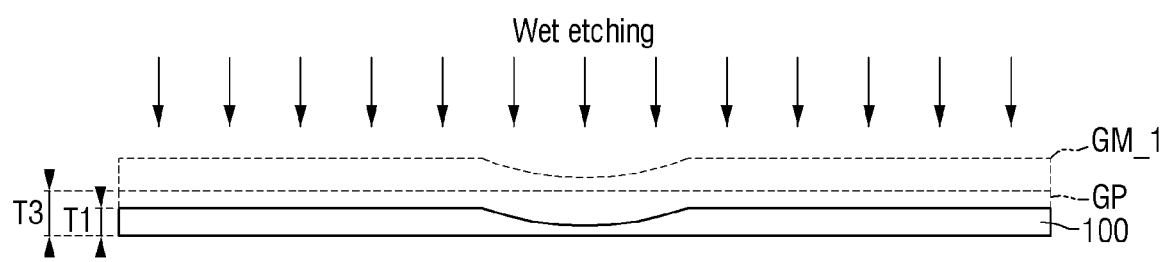

FIGS. 12 and 13 are cross-sectional views sequentially illustrating a fabrication process of a cover window according some example embodiments. FIGS. 12 and 13 illustrate a shape of a mask layer GM_1 and an etching process of the mask layer GM_1 and the glass article GP.

Referring to FIGS. 12 and 13, in the fabrication process of the cover window 100 according to some example embodiments, the mask layer GM_1 may include flat portions having flat upper surfaces and a recess portion RP having a gently curved upper surface. The embodiments illustrated with respect to FIGS. 12 and 13 are different from the embodiments illustrated with respect to FIG. 7 in that the shape of the recess portion RP of the mask layer GM_1 is different. Hereinafter, the shape of the mask layer GM_1 will be described in more detail, but some redundant description may be omitted.

The recess portion RP of the mask layer GM_1 may have a thickness smaller than the thicknesses of the flat portions, and the upper surface of the recess portion RP may have a gently curved shape. Unlike the embodiments illustrated with respect to FIG. 7, the recess portion RP may have a shape in which its thickness varies according to the position from a portion connected to the flat portion without the first portion having the flat upper surface. Because the cover window 100 fabricated through the etching process includes the slimming portion SP in which the first surface US is partially recessed with curvature, the shape of the mask layer GM_1 may also be formed correspondingly. Even when the glass article GP is isotropically etched through the wet etching process, the slimming portion SP may not be properly formed. In this case, the shape of the mask layer GM_1 is designed as shown in FIG. 12, thereby realizing the shape of the slimming portion SP of the cover window 100.

According to some example embodiments, the glass article GP may be fabricated as the cover window 100 through the wet etching process using the mask layer GM including water glass. The cover window 100 may include the slimming portion SP formed corresponding to the recess portion RP of the mask layer GM. In the cover window 100 fabricated by over-etching the mask layer GM including water glass and the glass article GP, the glass article GP is entirely etched while a portion thereof is further etched to form the slimming portion SP and the non-slimming portions NSP1 and NSP2. Accordingly, the boundaries between the slimming portion SP and the non-slimming portions NSP1 and NSP2 can be prevented from being visible from the outside. In addition, as the cover window 100 thus fabricated includes the non-slimming portions NSP1 and NSP2 which have larger thicknesses than the slimming portion SP, there is an advantage of increasing product durability.

The cover window 100 fabricated through the above-described method can be used in a display device including a plurality of pixels to display a screen. In particular, the foldable cover window 100 can be used in a foldable display device.

Figure 14:
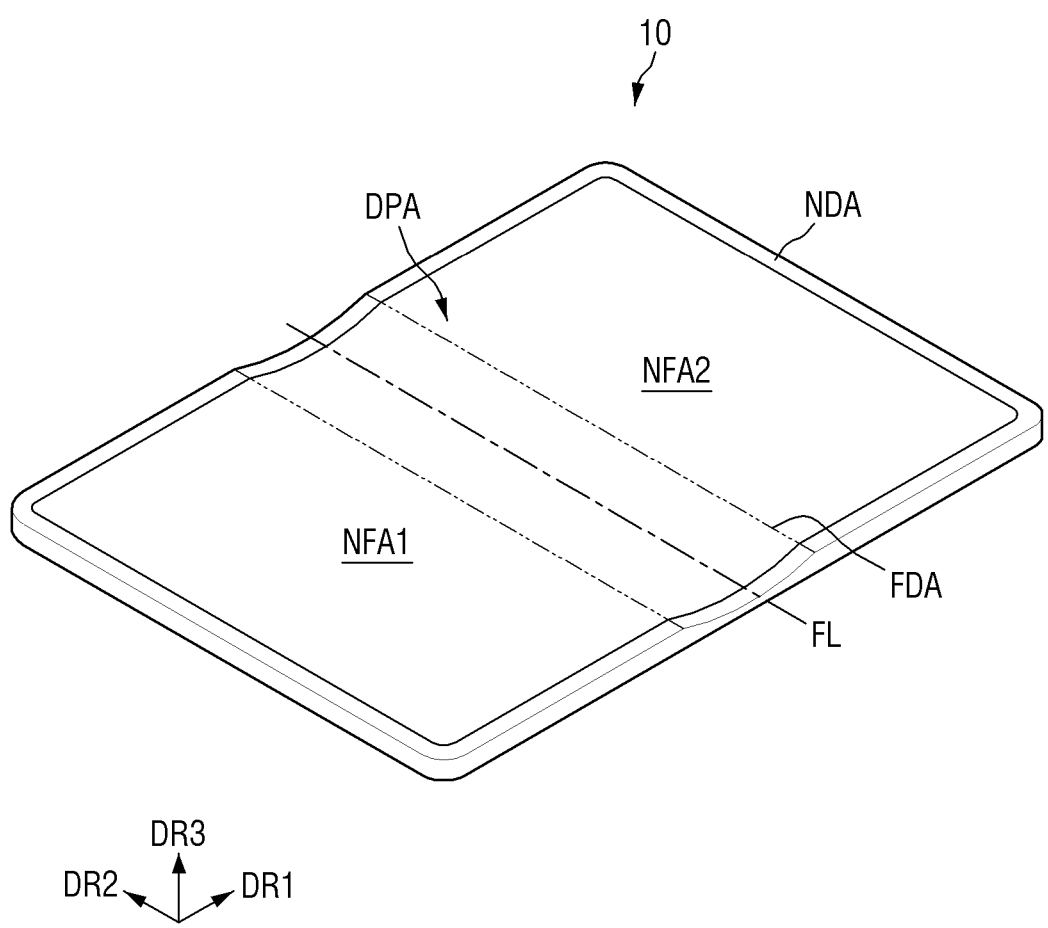
FIG. 14 is a cross-sectional view illustrating a display device including a cover window according to some example embodiments.
Figure 15:
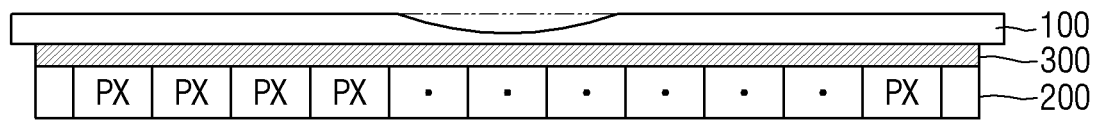
FIG. 15 is a schematic cross-sectional view of the display device of FIG. 14 according to some example embodiments.
Figure 16:
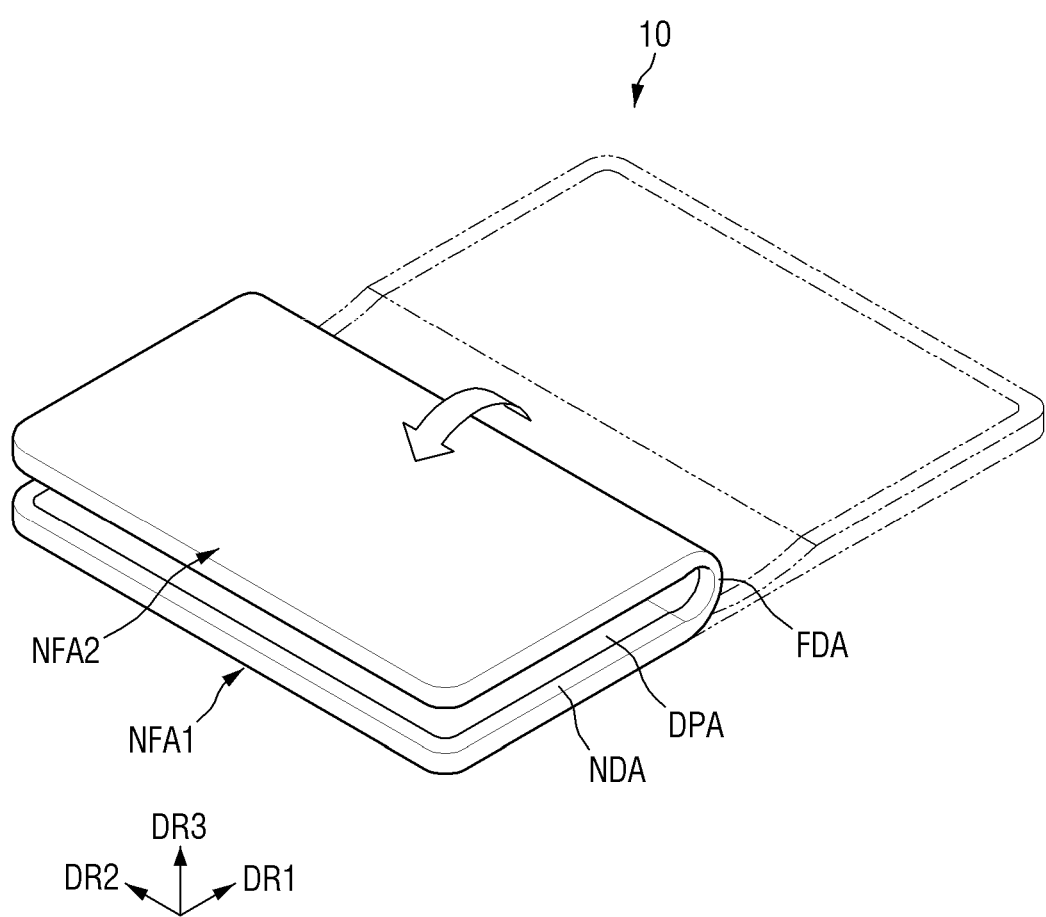
FIG. 16 is a cross-sectional view showing a folded state of the display device of FIG. 14 according to some example embodiments.

FIG. 14 is a cross-sectional view illustrating a display device including a cover window according some example embodiments. FIG. 15 is a schematic cross-sectional view of the display device of FIG. 14. FIG. 16 is a cross-sectional view showing a folded state of the display device of FIG. 14.

Referring to FIGS. 14 and 16, a display device 10 displays a screen or an image through a display area DPA, and various devices including the display area DPA may be included therein. Examples of the display device 10 may include, but are not limited to, a smartphone, a mobile phone, a tablet PC, a personal digital assistant (PDA), a portable multimedia player (PMP), a television, a game machine, a wristwatch-type electronic device, a head-mounted display, a monitor of a personal computer, a laptop computer, a car navigation system, a car's dashboard, a digital camera, a camcorder, an external billboard, an electronic billboard, various medical devices, various inspection devices, various household appliances such as a refrigerator and a washing machine including the display area DPA, an Internet-of-Things device, and the like. A typical example of a foldable display device to be described later may be a foldable smartphone, tablet PC or laptop computer, but is not limited thereto.

The display device 10 may have a substantially rectangular shape in plan view. The display device 10 may have a rectangular shape with right-angled or rounded corners in plan view. The display device 10 may include four sides or edges. The display device 10 may include long sides and short sides.

The display device 10 may include one surface and the other surface. At least one of one surface or the other surface of the display device 10 may be a display surface. According to some example embodiments, the display surface may be located on one surface of the display device 10 and display may not be performed on the other surface. Hereinafter, such embodiments will be mainly described, but the display device may be a double-sided display device in which display is performed on both one surface and the other surface.

The display device 10 may be divided into a display area DPA displaying an image or video and a non-display area NDA arranged around the display area DPA, in plan view, according to whether display is performed.

The display area DPA may include a plurality of pixels. The pixel is a basic unit for displaying a screen. The pixels may include, but not limited to, a red pixel, a green pixel, and a blue pixel. The pixels may further include a white pixel. The plurality of pixels may be alternately arranged in a plan view (e.g., when viewed in a direction normal or perpendicular with respect to the corresponding display surface). For example, the pixels may be arranged in a matrix, but the present disclosure is not limited thereto.

The non-display area NDA may be located around the display area DPA. The non-display area NDA may surround the display area DPA. According to some example embodiments, the display area DPA may be formed in a rectangular shape, and the non-display area NDA may be located around four sides of the display area DPA, but the present disclosure is not limited thereto. A black matrix may be located in the non-display area NDA to prevent light emitted from adjacent pixels from leaking out.

The display device 10 may be a foldable device. The display device 10 may include a folding area FDA that is folded with respect to the folding line FL. The folding area FDA may have a straight linear shape extending in one direction in plan view. Although the drawing illustrates an embodiment in which the folding area FDA extends parallel to the short side of the display device 10, embodiments according to the present disclosure are not limited thereto. For example, according to some example embodiments, the folding area FDA may be parallel to the long side or may be inclined with respect to the short side and the long side.

According to some example embodiments, the folding area FDA of the display device 10 may be determined at a specific location. One or two or more folding areas FDA may be determined at a specific location(s) in the display device 10. According to some example embodiments, the location of the folding area FDA may not be specified in the display device 10 and may be freely set in various areas.

The display device 10 may be divided into a first unfolding area NFA1 and a second unfolding area NFA2 by the folding area FDA. The first unfolding area NFA1 may be located on one side of the folding area FDA, and the second unfolding area NFA2 may be located on the other side of the folding area FDA. When the folding area FDA is determined at a specific location, the first unfolding area NFA1 and the second unfolding area NFA2 may be specified as an area in which folding is not performed. The specified first unfolding area NFA1 and second unfolding area NFA2 may have the same width, but are not limited thereto. When the folding area FDA is not specified, the first unfolding area NFA1 and the second unfolding area NFA2 may be changed according to a position where the folding area FDA is set.

The display area DPA of the display device 10 may be located over both the first unfolding area NFA1 and the second unfolding area NFA2. Further, the display area DPA may be located even in the folding area FDA corresponding to a boundary between the first unfolding area NFA1 and the second unfolding area NFA2. That is, the display area DPA of the display device 10 may be continuously formed irrespective of boundaries of the unfolding areas NFA1 and NFA2, the folding area FDA and the like. However, the present disclosure is not limited thereto, and the display area DPA may be located in the first unfolding area NFA1, but the display area DPA may not be located in the second unfolding area NFA2. Alternatively, the display area DPA may be located in the first unfolding area NFA1 and the second unfolding area NFA2, but the display area DPA may not be located in the folding area FDA.

According to some example embodiments, the folding area FDA of the display device 10 may be an area corresponding to the slimming portion SP of the cover window 100, and the non-folding areas NFA1 and NFA2 of the display device 10 may be areas respectively corresponding to the non-slimming portions NSP1 and NSP2 of the cover window 100. When the display device 10 is folded, the folding area FDA is folded with respect to the folding line FL, but the non-folding areas NFA1 and NFA2 may not be folded. Because the slimming portion SP is located in the folding area FDA, it can withstand the stress generated in folding. Further, the non-slimming portions NSP1 and NSP2 are located in the non-folding areas NFA1 and NFA2, thereby providing excellent durability against external impacts. In addition, the display device 10 includes the cover window 100 fabricated by the fabrication method of the cover window 100 according to some example embodiments, so that the boundaries between the slimming portion SP and the non-slimming portions NSP1 and NSP2 and the boundaries between the folding area FDA and the non-folding areas NFA1 and NFA2 can be prevented from being visible from the outside.

The display device 10 may be folded in an in-folding manner in which the display surface is folded inward such that the inside surfaces face each other, or folded in an out-folding manner in which the display surface is folded outward. The display device 10 may be folded in only one manner, i.e., an in-folding manner or out-folding manner. Alternatively, both the in-folding and the out-folding may be performed. In the case of the display device 10 in which both in-folding and out-folding are performed, in-folding and out-folding may be performed with respect to the same folding area FDA. Alternatively, it may include a plurality of folding areas FDA, such as a folding area FDA for in-folding only and a folding area FDA for out-folding only, which are used to perform different types of folding.

According to some example embodiments, the display device 10 may include a display panel, a layer, a panel and a substrate stacked thereon, which have flexibility, and the display device 10 may be folded by folding all the members. In some embodiments, at least a portion of the display panel or the members stacked thereon may have a separate shape with respect to the folding area FDA. In this case, the separated member located in the unfolding area may not have a flexible property.

The display device 10 may include a display panel 200, the cover window 100 located on the display panel 200 and a bonding member 300 located between the display panel 200 and the cover window 100 to bond the display panel 200 and the cover window 100.

Examples of the display panel 200 may include not only a self-luminous display panel such as an organic light emitting display (OLED) panel, an inorganic electroluminescence (EL) display panel, a quantum dot (QED) display panel, a micro-LED display panel, a nano-LED display panel, a plasma display panel (PDP), a field emission display (FED) panel and a cathode ray tube (CRT) display panel, but also a light receiving display panel such as a liquid crystal display (LCD) panel and an electrophoretic display (EPD) panel.

The display panel 200 includes a plurality of pixels PX and may display an image by using light emitted from each pixel PX. The display device 10 may further include a touch member or touch input sensor. According to some example embodiments, the touch member may be embedded in the display panel 200. For example, because the touch member is directly formed on a display member of the display panel 200, the display panel 200 itself may perform a touch function. According to some example embodiments, the touch member may be manufactured separately from the display panel 200 and then attached to the upper surface of the display panel 200 by an optically transparent bonding layer. The display panel 200 includes one surface positioned on the front side and the other surface positioned on the rear side. Light emitted from the pixel PX of the display panel 200 may be emitted toward the front side. That is, the display panel 200 may display a screen on the front side.

The cover window 100 of FIG. 1 is located on one surface of the display panel 200. The cover window 100 serves to protect the display panel 200. Because the cover window 100 is larger in size than the display panel 200, the side surface thereof may protrude outward from the side surface of the display panel 200, but it is not limited thereto. The cover window 100 may further include a printed layer located on at least one surface of the cover window 100 at an edge portion of the cover window 100. The printed layer of the cover window 100 may prevent the bezel area of the display device 10 from being visible from the outside, and may perform a decoration function in some cases.

The bonding member 300 is located between the display panel 200 and the cover window 100 or between one surface of the display panel 200 and the second surface LS of the cover window 100. The bonding member 300 serves to fix the cover window 100 onto the display panel 200. The bonding member 300 may include an optically clear adhesive (OCA), an optically clear resin (OCR), or the like.

In concluding the detailed description, those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation. While one or more embodiments have been described with reference to the figures, it will be understood by those of ordinary skill in the art that various changes in form and details may be made therein without departing from the spirit and scope as defined by the following claims and their equivalents.

What is claimed is:

1. A method of fabricating a cover window, the method comprising:
    forming, on a glass article having a flat upper surface, a mask layer including water glass and a recess portion having a partially recessed upper surface; and
    etching the mask layer and the glass article to form a cover window having a partially recessed upper surface.

2. The method of claim 1, wherein forming the mask layer further comprises:
    coating a water glass layer on the upper surface of the glass article; and
    etching a portion of an upper surface of the water glass layer to from the mask layer.

3. The method of claim 2, wherein the mask layer includes the recess portion and a flat portion having a flat upper surface, which is connected to the recess portion, and
    a thickness of the recess portion is smaller than a thickness of the flat portion.

4. The method of claim 3, wherein the recess portion includes a first portion having a flat upper surface and a second portion connecting the first portion to the flat portion and having an inclined upper surface.

5. The method of claim 3, wherein the recess portion has a curved upper surface.

6. The method of claim 1, wherein the forming of the cover window is performed by a wet etching process.

7. The method of claim 6, wherein in the forming of the cover window, the mask layer is dissolved by an etchant and the upper surface of the glass article is partially etched.

8. The method of claim 6, wherein in the glass article, a portion corresponding to the recess portion of the mask layer is etched to have a curved upper surface, and
    a portion corresponding to an area other than the recess portion is etched to have a flat upper surface.

9. The method of claim 6, wherein the mask layer and the glass article are over-etched by wet etching.

10. The method of claim 9, wherein a maximum thickness of the cover window is smaller than a thickness of the glass article.

11. The method of claim 1, wherein the cover window includes a first surface and a second surface that is flat and opposite to the first surface, and
    further includes a non-slimming portion in which the first surface is flat and a slimming portion in which the first surface is partially recessed,
    wherein the slimming portion has a thickness smaller than that of the non-slimming portion.

12. The method of claim 11, wherein a portion of the first surface where the slimming portion is located has a curved shape.

13. The method of claim 11, wherein a first thickness of the non-slimming portion has a range of 0.1 millimeters (mm) to 20 mm, and
    a second thickness of the slimming portion has a range of 0.01 mm to 0.1 mm.

14. The method of claim 13, wherein a width of the slimming portion has a range of 20 mm or less.

15. The method of claim 11, wherein the cover window is configured to be folded such that the first surface faces inward with respect to a folding line placed in the slimming portion.

16. A cover window comprising:
    a first surface;
    a second surface opposite the first surface that is flat and folded such that the first surface faces inward with respect to a folding line;
    a non-slimming portion at which the first surface is flat; and
    a slimming portion at which the first surface is partially recessed and having a thickness smaller than the non-slimming portion,
    wherein the folding line is located in the slimming portion, and
    the slimming portion has a curved shape.

17. The cover window of claim 16, wherein a first thickness of the non-slimming portion has a range of 0.1 millimeters (mm) to 20 mm, and
    a second thickness of the slimming portion has a range of 0.01 mm to 0.1 mm.

18. The cover window of claim 17, wherein a width of the slimming portion has a range of 20 mm or less.

19. The cover window of claim 17, wherein a length measured from the slimming portion to a center of curvature of the first surface in a state of being folded with respect to the folding line has a range of 1 mm to 2 mm.

20. An in-foldable display device configured to be folded such that a display surface faces inward, the in-foldable display device comprising:
    a display panel including a first surface located on a front side and a second surface located on a rear side and displaying a screen on the front side;
    a cover window on the first surface of the display panel and including a third surface and a fourth surface which is flat and opposite to the third surface; and
    a bonding member between the fourth surface of the cover window and the display panel, wherein the cover window includes a non-slimming portion in which the third surface is flat and a slimming portion in which the third surface is partially recessed and having a thickness smaller than the non-slimming portion, and the slimming portion has a curved shape.

\* \* \* \* \*